United States Patent
Bedau

(10) Patent No.: US 10,644,066 B2
(45) Date of Patent: May 5, 2020

(54) SIDEWALL INSULATED RESISTIVE MEMORY DEVICES

(71) Applicant: Western Digital Technologies, Inc., San Jose, CA (US)

(72) Inventor: Daniel Bedau, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/009,075

(22) Filed: Jun. 14, 2018

(65) Prior Publication Data

US 2018/0301507 A1 Oct. 18, 2018

Related U.S. Application Data

(62) Division of application No. 15/142,344, filed on Apr. 29, 2016.

(51) Int. Cl.
*H01L 45/00* (2006.01)
*H01L 27/24* (2006.01)
*H01L 23/528* (2006.01)

(52) U.S. Cl.
CPC ........ *H01L 27/2463* (2013.01); *H01L 23/528* (2013.01); *H01L 45/124* (2013.01);
(Continued)

(58) Field of Classification Search
CPC ....... H01L 27/2463; H01L 45/16–1658; H01L 45/08–085; H01L 45/1233; H01L 45/1608; H01L 27/2436; H01L 27/249; H01L 27/10; H01L 27/1052; H01L 29/40114; H01L 45/1641; G11C 2213/53;
(Continued)

(56) References Cited

U.S. PATENT DOCUMENTS 3,558,212 A1 10/2013 Jo
8,852,996 B2 10/2014 Wang et al.
(Continued)

OTHER PUBLICATIONS

Park et al., Improved resistive switching phenomena observed in SiNx-based resistive switching memory through oxygen doping process, Phys. Status Solidi, 2014, pp. 239-242, vol. 8, No. 3 Located at: http://www.researchgate.net/publication/259542290_Improved_resistive_Switching_phenomena_observed_in_SiNx-based_resistive_switching_memory_through_oxygen_doping_process.

(Continued)

*Primary Examiner* — Eric A. Ward
*Assistant Examiner* — Eric K Ashbahian
(74) *Attorney, Agent, or Firm* — Patterson & Sheridan, LLP

(57) ABSTRACT

To provide enhanced data storage devices and systems, various systems, architectures, apparatuses, and methods, are provided herein. In a first example, a resistive memory device is provided. The resistive memory device includes an active region having resistance properties that can be modified to store one or more data bits in the resistive memory device, and at least one sidewall portion of the active region comprising a dopant configured to suppress conductance paths in the active region proximate to the at least one sidewall portion. The resistive memory device includes terminals configured to couple the active region to associated electrical contacts.

20 Claims, 8 Drawing Sheets

(52) U.S. Cl.
CPC ...... *H01L 45/1206* (2013.01); *H01L 45/1246* (2013.01); *H01L 45/146* (2013.01); *H01L 45/1608* (2013.01); *H01L 45/1641* (2013.01); *H01L 45/1658* (2013.01); *H01L 45/1683* (2013.01)

(58) Field of Classification Search
CPC . G11C 2213/79; G11C 11/56; G11C 11/5621; G11C 11/5685; G06F 11/1072
See application file for complete search history.

(56) References Cited

U.S. PATENT DOCUMENTS

| | | | |
|---|---|---|---|
| 8,912,518 | B2 | 12/2014 | Chi et al. |
| 8,981,335 | B2 | 3/2015 | Ananthan et al. |
| 9,012,260 | B2 | 4/2015 | Barabash et al. |
| 9,412,790 | B1* | 8/2016 | Clark ............ H01L 27/2481 |
| 9,754,999 | B1* | 9/2017 | Takaki ............ H01L 27/2454 |
| 2009/0212351 | A1* | 8/2009 | Chen ............... B82Y 10/00 257/324 |
| 2010/0078615 | A1* | 4/2010 | Ito ............... G11C 13/0007 257/2 |
| 2011/0068409 | A1* | 3/2011 | Kim ............ H01L 29/66666 257/379 |
| 2012/0063194 | A1 | 3/2012 | Baek et al. |
| 2012/0268980 | A1* | 10/2012 | Awaya ........... G11C 13/0007 365/148 |
| 2013/0009128 | A1 | 1/2013 | Ribeiro et al. |
| 2013/0015540 | A1* | 1/2013 | Choi ............... H01L 43/02 257/421 |
| 2013/0026438 | A1 | 1/2013 | Wang et al. |
| 2013/0089949 | A1* | 4/2013 | Phatak ............ H01L 45/1616 438/104 |
| 2013/0122651 | A1* | 5/2013 | Fujii ............ H01L 27/101 438/104 |
| 2013/0168629 | A1* | 7/2013 | Ribeiro ........... H01L 45/08 257/3 |
| 2014/0301127 | A1* | 10/2014 | Kim ............... G11C 13/0004 365/148 |
| 2015/0003144 | A1* | 1/2015 | Eleftheriou ........ G11C 11/5614 365/148 |
| 2015/0093876 | A1 | 4/2015 | Butcher et al. |
| 2015/0129824 | A1* | 5/2015 | Lee ............... H01L 45/04 257/2 |
| 2016/0233422 | A1* | 8/2016 | Jo ............... H01L 45/1253 |
| 2016/0314847 | A1* | 10/2016 | Yang ............ G06F 11/1072 |

OTHER PUBLICATIONS

Long et al., Effects of Mg-Doping on Hfo2-Based ReRAM Device Switching Characteristics, Electron Device Letters, IEEE, pp. 1247-1249, Aug. 23, 2013, vol. 34, Issue 10 (Abstract provided) Located at: http://ieeexplore.ieee.org/xpl/login.jsp?tp=&arnumber=6585756 &url=http%3A%2F%2Fieeexplore.ieee.org%2Fiel7%2F55% 2F6606835%2F6585756.pdf%3Farnumber%3D6585756.

* cited by examiner

SIDEWALL INSULATED RESISTIVE MEMORY DEVICES

CROSS-REFERENCE TO RELATED APPLICATIONS

This application is a divisional of co-pending U.S. patent application Ser. No. 15/142,344, filed Apr. 29, 2016. The aforementioned related patent application is herein incorporated by reference.

BACKGROUND OF THE DISCLOSURE

Field of the Disclosure

Aspects of the disclosure are related to the field of data storage and resistive random access memory in data storage devices.

Description of the Related Art

Computer and network data systems such as personal computers, workstations, server systems, and cloud storage systems, typically include data storage devices for storing and retrieving data. These data storage devices can include hard disk drives (HDDs), solid state storage drives (SSDs), tape storage devices, optical storage drives, hybrid storage devices that include both rotating and solid state data storage elements, and other mass storage devices. Recently, new storage technologies have been developed which employ resistive memory elements. These resistive memory elements can include resistive random-access memory (RRAM or ReRAM), which are types of non-volatile random access memory that store data by altering a resistance of a solid-state material. However, resistive memory elements can be difficult to manufacture and incorporate into memory devices.

SUMMARY OF THE DISCLOSURE

To provide enhanced data storage devices and systems, various systems, architectures, apparatuses, and methods, are provided herein. In a first example, a resistive memory device is provided. The resistive memory device includes an active region having resistance properties that can be modified to store one or more data bits in the resistive memory device, and at least one sidewall portion of the active region comprising a dopant configured to suppress conductance paths in the active region proximate to the at least one sidewall portion. The resistive memory device includes terminals configured to couple the active region to associated electrical contacts.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

High-density storage devices employ a variety of storage technologies. Magnetic storage devices have been employed in many storage systems, such as hard disk drives with rotating magnetic media. More recently, solid state storage devices, such as flash drives employing NAND flash or other semiconductor-based memory technologies have become popular as associated densities have increased. Other storage technologies, such as optical and non-rotating magnetic technologies are also employed. However, resistive non-volatile memory (NVM) technologies have become possible using materials which have alterable electrical properties, such as electrical resistances, that persist after application of an electric current. These resistive memory devices include memristors and other related devices. Memristors typically comprise two-terminal electrical components which relate electric charge to magnetic flux linkage, where an electrical resistance of a memristor depends upon a previous electrical current passed by the memristor. Although memristors can be incorporated into non-volatile memories, it has been difficult to incorporate arrays of these memristors into storage devices, in part due to difficulty in achieving addressable memory arrays.

As will be seen herein, various enhanced architectures and devices employ two-terminal resistive memory devices and three-terminal resistive memory devices as non-volatile storage elements. In some examples, these resistive memory devices comprise three-terminal devices that include a gate, source, and drain terminals, with the gate terminal employed to alter resistance properties, such as electrical resistances, of an active channel between the source and drain terminals. These three-terminal devices can be referred to as resistive random-access memory (ReRAM) devices or ReRAM elements. However, the enhancements herein apply to two-terminal (source-active channel-drain) and three-terminal devices (source-active channel-drain with gate) resistive memory devices. As discussed below, resistive memory elements/devices include resistive memory material in an active channel portion positioned between source and drain terminals. The resistive memory material comprises flux linkage-controlled resistor material, and the elements described herein can be formed from various metal oxides through reduction or oxidation processes.

Figure 1:
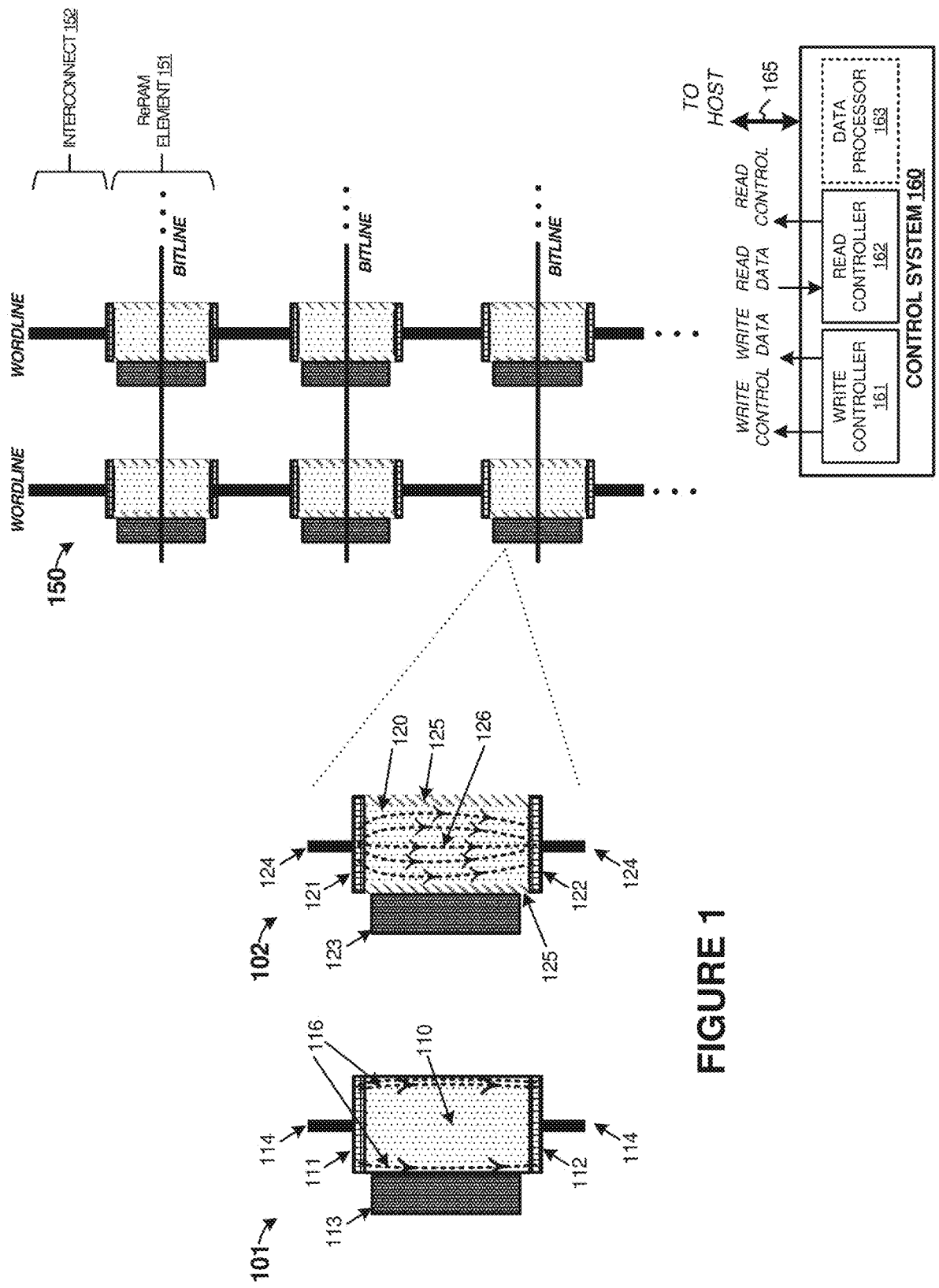
FIG. 1 is a system diagram illustrating a resistive memory array.

FIG. 1 is presented to illustrate exemplary three-terminal resistive memory devices in an arrayed configuration. Two-terminal devices can instead be employed, and these will be further illustrated in at least FIG. 2. Turning now to FIG. 1, FIG. 1 is a system diagram illustrating a resistive memory array. Specifically, FIG. 1 shows array 150 comprising a plurality of ReRAM elements 151 and interconnect 152. ReRAM elements 151 are interconnected via interconnect elements and form wordlines in the 'vertical' direction and bitlines in the 'horizontal' direction, although different configurations are possible. Devices 101 and 102 show two examples of ReRAM elements 151 which can be employed in array 150, although variations are possible. Device 101 illustrates a ReRAM device without sidewall doping, while device 102 illustrates a device with sidewall doping.

Figure 5:
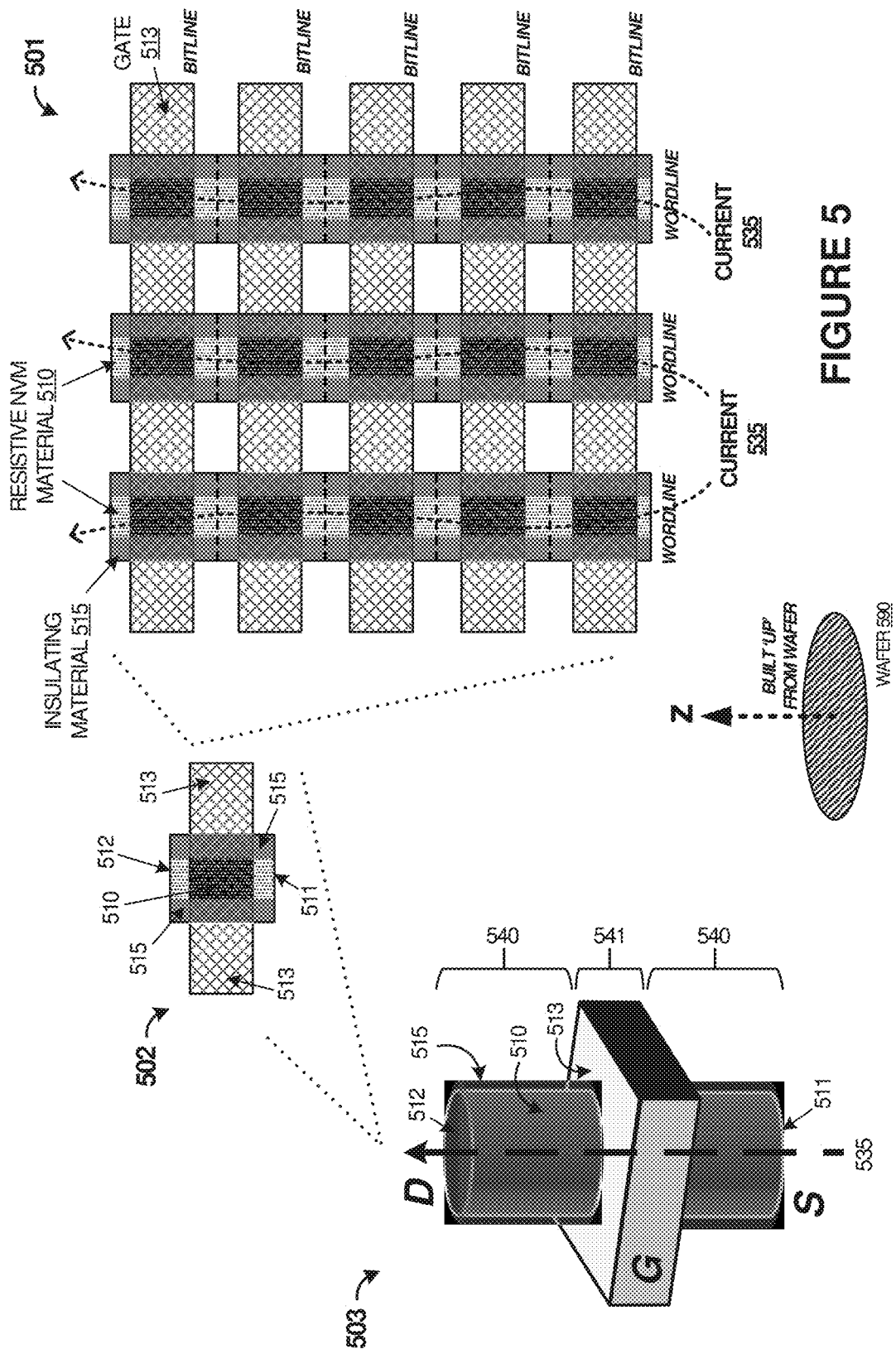
FIG. 5 is a system diagram illustrating a resistive memory array.

Array 150 can be built up vertically (i.e. in a 'z' direction) from a wafer or substrate, such as shown for wafer 590 in FIG. 5. Array 150 can be built onto one or more semiconductor logic layers, metallization layers, and interconnect layers, which are shown in later examples. The underlying logic and interconnect can be related to a logic circuits, processors, control systems, or other elements which can at least control the elements of memory layers formed on top of semiconductor layers. For example, when a semiconductor wafer is employed for creation of logic circuitry and associated interconnect, then one or more layers of resistive memory can be formed on top of logic circuitry and associated interconnect using techniques found in semiconductor wafer processing and microfabrication, such as photo-lithography, diffusing, deposition, epitaxial growth, etching, annealing, and ion implanting, among others.

Turning now to device 101, this device includes active channel 110, source terminal 111, drain terminal 112, gate terminal 113, and interconnect 114. Active channel 110 comprises resistive memory material for forming a non-volatile memory cell. Active channel 110 can have associated resistance properties altered using gate terminal 113, and these resistance properties can be used to store one or more bits of data, such as predetermined resistance levels corresponding to one or more bits of data. However, irregularities and surface defects in sidewalls 116 of device 101 can lead to pathways which are of higher conductance or lower resistance than a central part of active channel 110. This can cause 'shorting' of current between source terminal 111 and drain terminal 112 and inaccurate storage and retrieval of associated data bits.

Device 102 includes active channel 120, source terminal 121, drain terminal 122, gate terminal 123, and interconnect 124. Active channel 120 comprises resistive memory material for forming a non-volatile memory cell. Active channel 120 can have associated resistance properties altered using gate terminal 123, and these resistance properties can be used to store one or more bits of data. In device 102, sidewalls 125 have had a dopant introduced. This dopant can provide enhanced operation of active channel 120 and device 102 by at least compensating for irregularities and defects at the sidewalls of active channel 120. Specifically, the dopant can increase a dielectric property of the sidewalls to reduce conductance paths across the sidewalls and push current flow into a more central area 126 of active channel 120. Further examples of manufacturing techniques for ReRAM arrays and individual memory devices are discussed in the following examples below.

During operation, control system 160 can be employed to control the elements of ReRAM array 150. Control system 160 can be included to control each of the resistive memory elements for reading and writing of data bits into associated memory cells. Control system 160 can be formed in logic on the same wafer as ReRAM array 150 or included in separate circuitry or logic devices.

In write operations, control system 160 can apply a voltage the gates of each ReRAM element over associated gate links which will alter resistance properties of resistive non-volatile memory (NVM) material in the associated active channels. Altered resistance properties can be used to store data bits in memory cells, with values of the resistance properties indicating various bit values, such as a binary '1' or '0'—although multi-level bit logic can be employed to store many bits per memory cell depending upon the resistance properties.

In read operations, control system 160 can measure a series resistance across all of the ReRAM elements using interconnect links 152. This series resistance might not indicate the data stored by individual memory cells, as all three memory cells in this example would be measured in series. Control system 160 can also measure individual memory cells by measuring resistances through individual gates and interconnect 152. Further resistance measurements can be employed. These various resistance measurements can be processed to identify data bits stored in each memory cell, which can include comparing the series resistance of the entire array to individual gate-selected resistance measurements.

Turning now to the elements of control system 160, FIG. 1 illustrates a control system or controller which can be employed to interface with one or more resistive memory arrays, such as array 150 or individual devices 101 or 102. Control system 160 is representative of any logic, control systems, or collection of logic and systems in which the various resistive memory read, write, and other operational architectures, scenarios, and processes disclosed herein may be implemented. For example, control system 160 can be employed in any of the sublayer logic onto which memory array 150 is formed. Features of control system 160 can be incorporated into further devices and systems, such as external controllers, logic modules, microprocessors, computing devices, or distributed computing devices, as well as any variation or combination thereof.

Control system 160 may be implemented as a single apparatus, system, or device or may be implemented in a distributed manner as multiple apparatuses, systems, or devices. For example, control system 160 can comprise one or more application-specific integrated circuits (ASICs), field-programmable gate arrays (FPGA), or discrete logic and associated circuitry, including combinations thereof. Although not shown in FIG. 1, control system 160 can include communication interfaces, network interfaces, user interfaces, and other elements for communicating with a host system over communication link 165. Control system 160 may optionally include additional devices, features, or functionality not discussed for purposes of brevity.

Control system 160 can also comprise or communicate with one or more microcontrollers or microprocessors with software or firmware included on computer-readable storage media devices. If software or firmware is employed, the computer-readable storage media devices may include volatile and nonvolatile, removable and non-removable media implemented in any method or technology for storage of information, such as computer readable instructions, data structures, program modules, or other data. Examples of storage media include random access memory, read only memory, magnetic disks, resistive memory devices, ReRAM devices, optical disks, flash memory, virtual memory and non-virtual memory, magnetic cassettes, magnetic tape, magnetic disk storage or other magnetic storage devices, or any other suitable storage media.

Control system 160 includes various controller portions to control resistive memory arrays, namely write controller 161, read controller 162, and optionally data processor 163. Write controller 161 writes data into resistive memory devices discussed herein, such as by using gate features or gate terminals of resistive memory devices. Write control signaling can include bitlines and wordlines which are used to uniquely address a resistive memory device to write data into that resistive memory device. In some examples, only entire wordlines are addressable and thus an entire wordline of data is written into associated resistive memory devices simultaneously. Read controller 162 reads data stored in resistive memory devices. The read process can include measuring resistance properties of ones of the resistive memory devices. For example, read controller 162 is communicatively coupled to ends of wordlines or the resistive memory devices and measure at least a series resistance property of each of the wordlines. Read controller 162 can also be communicatively coupled to ends of the bitlines of the resistive memory devices and individually select ones of the bitlines to measure an associated resistance property of a subset of the resistive memory devices as a series resistance property through a bitline-selected gate portion and a selected wordline. Read controller 162 can determine data stored by ones of the resistive memory devices by at least processing the series resistance property of a wordline that contains the at least the resistive memory devices being read and a resistance property of a subset of the resistive memory devices being read. Other techniques can be employed to measure and read data from each of the resistive memory devices. Data processor 163 is optionally included to further process data, such as to arrange data into logical arrangements including words, pages, and the like, before transfer to a host over link 165. Data processor 163 can also be configured to perform encoding/decoding or encryption/decryption operations with respect to the data stored in an associated resistive memory array.

Figure 2:
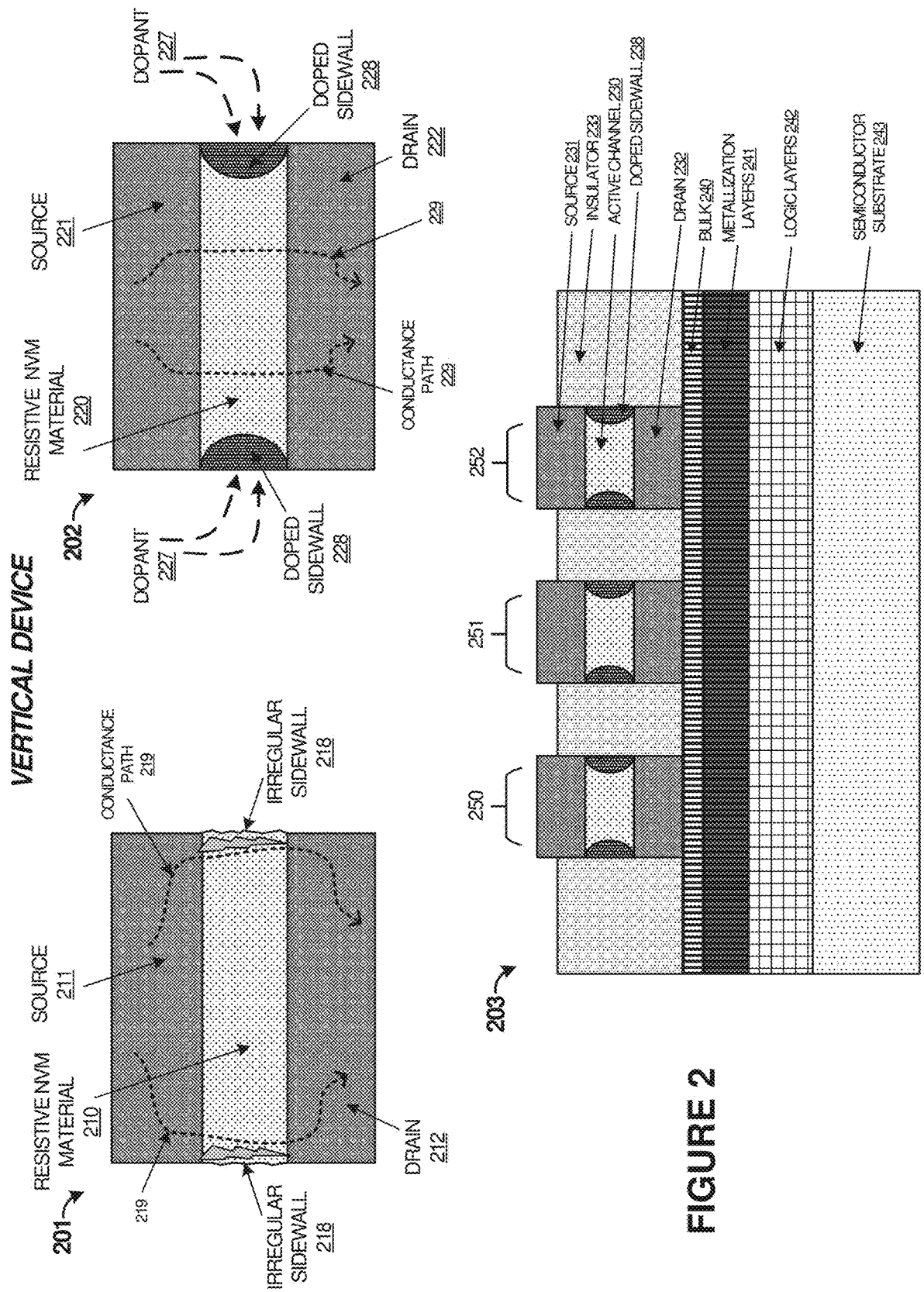
FIG. 2 illustrates manufacture of resistive memory arrays.
Figure 3:
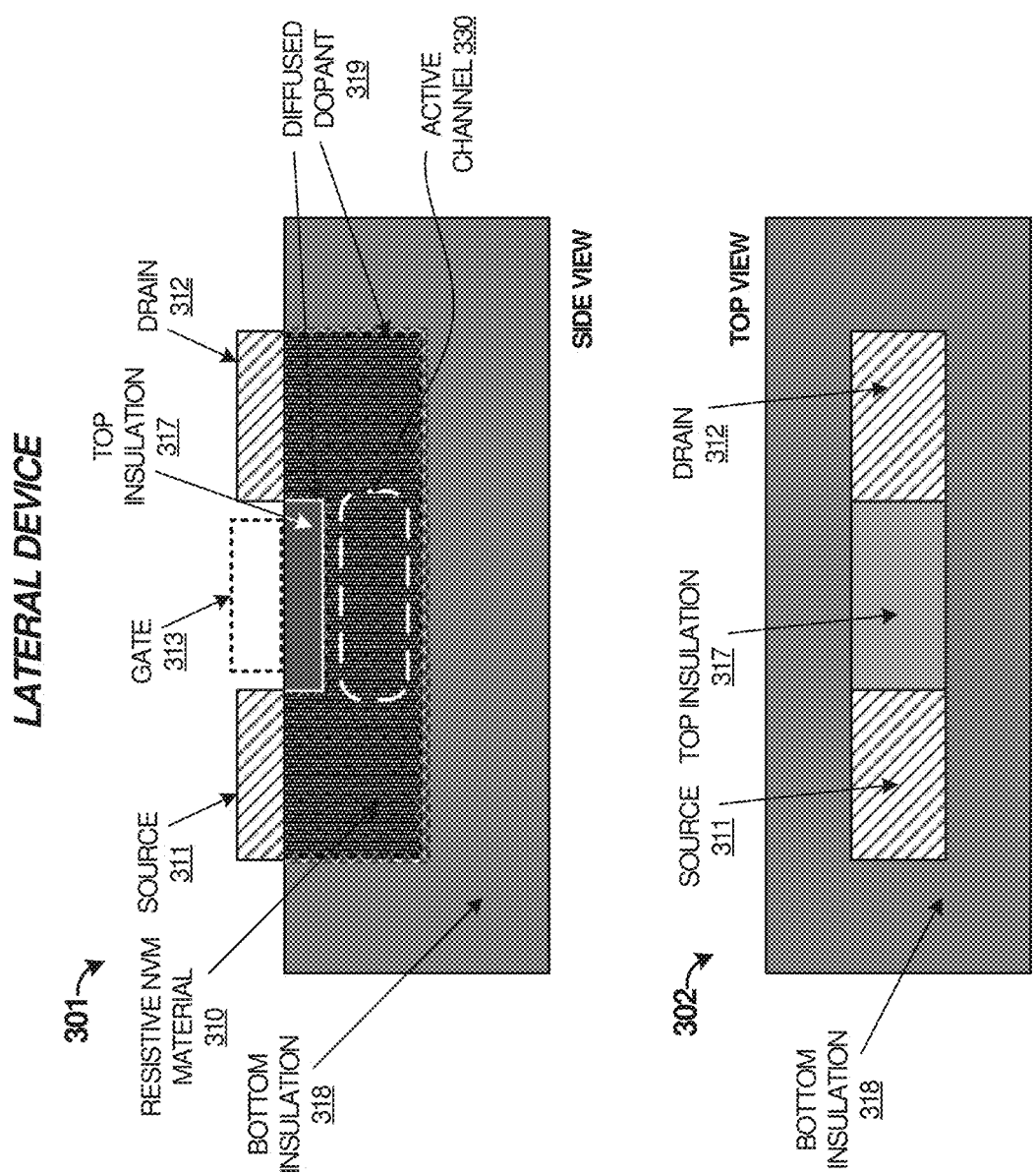
FIG. 3 illustrates a resistive memory device.
Figure 4:
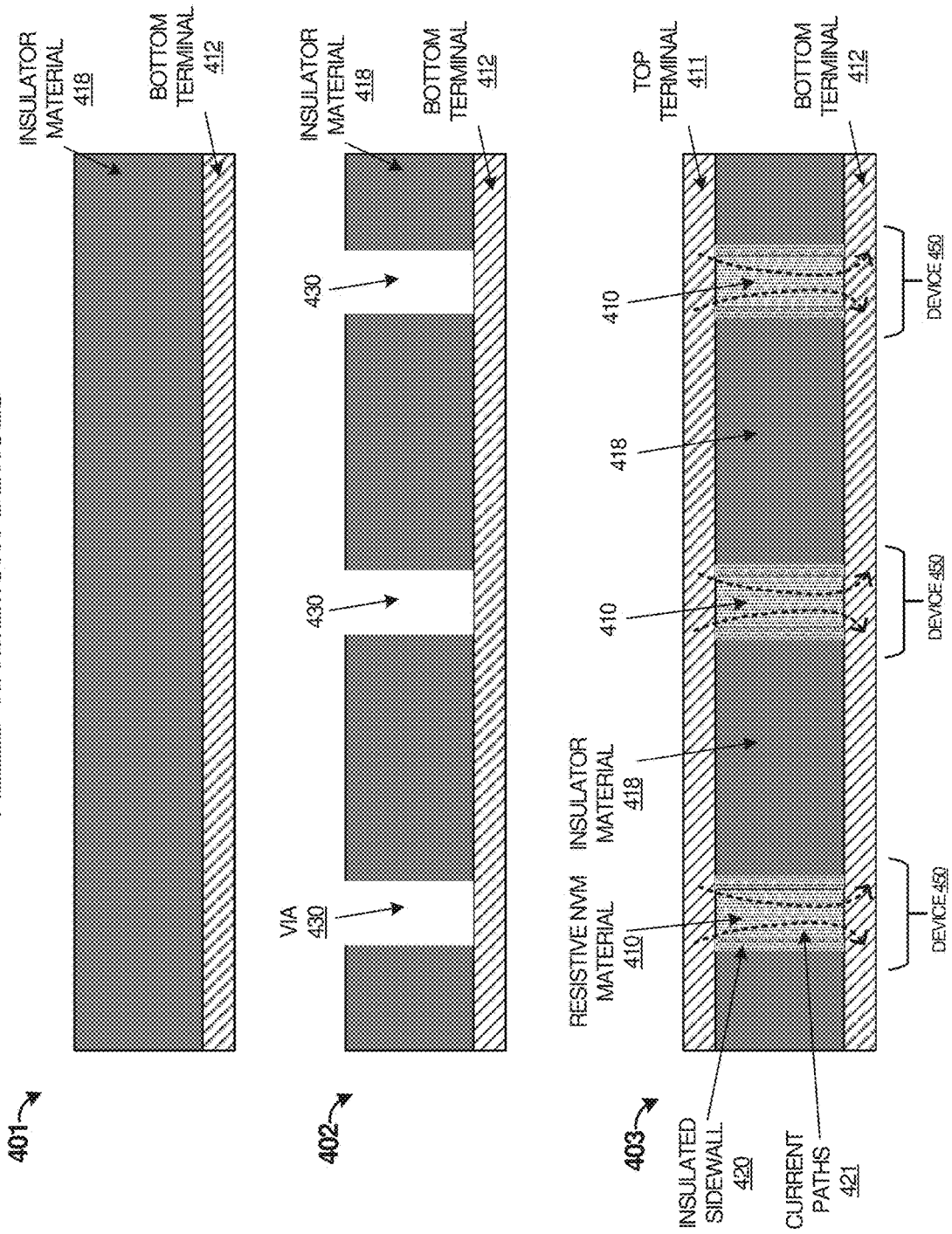
FIG. 4 illustrates manufacture of resistive memory arrays.

FIGS. 2-4 each show various cross-sectional, side, and top views of manufacturing processes and structures for forming a resistive memory array, such as the memory array shown in FIG. 1, although variations are possible. It should be noted that the thicknesses and other dimensions of the various elements, layers, and materials employed herein can depend on properties of the specific materials employed, properties desired for the devices, manufacturing techniques employed, among other considerations.

In FIG. 2, three configurations 201, 202, and 203 are illustrated. In the configurations shown in FIG. 2, a 'top' side of a resistive memory material is proximate to a source terminal and a 'bottom side' of the resistive memory material is proximate to a drain terminal. It should be understood that the top, sidewalls, and bottom portions of the resistive memory material can be in different configurations depending on orientation of the resistive memory device, preferred conduction direction, gate configurations, or other considerations. Other elements to form a resistive memory device, such as gate elements or substrates, are omitted from some of the configurations for clarity.

Configuration 201 illustrates a cross-sectional view of an example resistive memory device with un-doped sidewalls of an active region, such as before a doping process occurs. Configuration 201 includes resistive NVM material 210 forming an active region or active channel for storing one or more bits of data in a resistive memory material, along with proximate source 211 and drain 212 terminals. In configuration 201, irregular sidewalls 218 are shown which can lead to conductance paths 219 forming near the sidewalls indicated in configuration 201. Conductance paths 219 can lead to memory performance degradation of the associated resistive memory device due in part to 'shorting' currents encountered during read or write processes and associated inaccurate storage and retrieval of data bits.

Configuration 202 illustrates a cross-sectional view of an example resistive memory device with doped sidewalls, such as after dopant 227 is introduced into resistive NVM material 220. Configuration 202 includes resistive NVM material 220, source terminal 221, drain 222. In configuration 202, sidewalls 228 have dopant 227 introduced. This dopant can provide enhanced operation of an active channel of resistive NVM material 220 by at least compensating for irregularities and defects at the sidewalls of the active channel of resistive NVM material 220. Specifically, the dopant can increase a dielectric property of the sidewalls to reduce conductance paths proximate to the sidewalls and push current flow into a more central area of the active channel of resistive NVM material 210. Configuration 202 shows conductance paths 229 in a more central region of the active channel of resistive NVM material 220.

Configuration 203 illustrates a cross-sectional view of an example resistive memory array with doped sidewalls 238 in each resistive memory device. Three resistive memory devices 250-252 are shown in configuration 203, although other examples can include a different number of devices. Moreover, configuration 203 shows vertically oriented resistive memory devices, with insulator material on at least the horizontal sides of each device. The insulator material can be partially enveloping of each device, such as on a single side, or can fully envelop each resistive memory device, such as shown in FIG. 5. In further examples, the insulator material can include gate material or gate portions proximate to the active channels that form bitlines for a wordline of three-terminal resistive memory devices, and more than one vertical layer of resistive memory devices can be employed.

Each resistive memory device includes an active channel (230), source terminal (231), drain terminal (232), insulator material (233), and doped sidewalls (238). Doped sidewalls 238 can be formed by etching out vias or voids into insulator material 223, then introducing a dopant onto the sidewalls of the voids, such as by using chemical deposition techniques to apply the dopant to the sidewalls of the voids or by filling the voids with the dopant and re-etching smaller voids to leave a portion of the dopant behind on the sidewalls. Heat can be applied once the dopant is deposited or filled to diffuse the dopant into the active channels and create doped sidewalls 238. Other techniques or processes can be employed to introduce the dopant material into sidewalls of the active channel of each resistive memory device.

Source and drain terminal elements discussed herein, such as source 231 and drain 232, can be formed from various materials. In a first example, similar or the same material used for resistive NVM material 220 or active channel 230 can be altered chemically to form terminals or electrodes suitable for source and drain elements. In this first example, further material can be introduced into layers or portions of resistive NVM material to modify a resistance or conductance property into a conductive state above a desired conductance levels or below desired resistance levels. This process can be a diffusion process to introduce more metallic materials of a metal oxide to enhance conductivity of the metal oxide material. In examples where tantalum oxide is employed for the resistive NVM material, further tantalum can be included to form a source or drain element. In examples, where hafnium oxide is employed for the resistive NVM material, further hafnium can be included to form the source or drain elements. In a second example, an oxidation range of metal oxide material comprising resistive NVM material is altered into a high oxidation state or low reduction state, so the metal oxide exhibits conductive properties. Other example materials are possible and suitable for source and drain elements, such as metallized material or metal material, polycrystalline silicon material, or others, including combinations thereof.

In some examples, insulator material 233 comprises an electrical insulator or dielectric material, such as a metal oxide material including hafnium oxides ($HfO_n$), tantalum oxides ($TaO_m$), zirconium oxides ($ZrO_p$), or any other suitable metal oxide, where 'n' and 'p' can vary based on levels of oxidation and reduction of the base chemical/metal. These metal oxides can comprise 'binary' metal oxides. Binary metal oxides discussed herein have properties that can be altered depending upon a level of oxidation, specifically resistive memory properties, conductive properties, or insulating properties. In a first oxidation range comprising a low oxidation state or highly reduced state, the binary metal oxide exhibits insulating properties. Other insulating materials can be employed, such as polycrystalline silicon material, silicon dioxide, or other materials.

Configuration 203 also shows the resistive memory array formed as one or more layers onto a plurality of sublayers. The resistive memory array can be built up vertically (i.e. in a 'z' direction) from a wafer or substrate, such as shown for wafer 590 in FIG. 5. The resistive memory array can be formed onto one or more sublayers, such as bulk 240, metallization layers 241, logic layers 242, and semiconductor substrate layers 243, among other layers. The underlying logic and interconnect can be related to a logic circuits, processors, control systems, or other elements which can at least control the elements of the resistive memory array layers formed on top of semiconductor layers. For example, when a semiconductor wafer is employed for creation of logic circuitry and associated interconnect, then one or more layers of resistive memory can be formed on top of logic circuitry and associated interconnect using techniques found in semiconductor wafer processing and microfabrication, such as photo-lithography, diffusing, deposition, epitaxial growth, etching, annealing, and ion implanting, among others.

FIG. 3 illustrates further example configurations of resistive memory devices and processes for manufacturing such devices. Specifically, FIG. 3 illustrates configuration 301 and 302 for a lateral ReRAM device which can be a single device or part of a larger array of devices. In configuration 301, a side cross-sectional view is shown. Configuration 302 illustrates a top view of the ReRAM device with optional gate 313 omitted for clarity. It should be understood that the top, sidewalls, and bottom portions of the resistive memory material can be in different configurations depending on orientation of the ReRAM device, preferred conduction direction, gate configurations, or other considerations. Other elements to form a ReRAM device, such as substrates and interconnect, are omitted from the configurations for clarity.

In configuration 301, a side view of a ReRAM device is shown that includes bottom insulation portion 318, resistive NVM material 310, and top insulation portion 317. Source terminal 311 and drain terminal 312 are coupled to respective portions of resistive NVM material 310, and optional gate terminal 313 is positioned proximate to an active channel 330 of the ReRAM device. Resistive properties of the resistive NVM material can be altered according to a voltage applied to gate 313, which changes resistive properties of active channel 330 and stores one or more bits of data in the ReRAM device. Source 311, drain 312, and gate 313 can be coupled via interconnect to further ReRAM devices in arrayed configurations or to control circuitry, including combinations thereof.

Configuration 301 illustrates doped sidewalls, such as after dopant 319 is diffused into outer walls of resistive NVM material 310. This dopant can provide enhanced operation of active channel 330 of resistive NVM material 310 by at least compensating for irregularities and defects at the sidewalls of active channel 330 and resistive NVM material 310. Specifically, the dopant can increase a dielectric property of the sidewalls to reduce conductance paths proximate to the sidewalls and push current flow into a more central area of the active channel of resistive NVM material 310.

Top insulation portion 317 can protect active channel 330 or other portions of resistive NVM material 310 from contaminants, further structures, metallization, migration of metal ions, atmosphere, oxygen, or other materials, including combinations thereof. Top insulation portion 317 can be formed with a passivation layer created in active channel 330. This passivation layer provides a layer of isolation between active channel 330. Bottom insulation portion 318 and top insulation portion 317 can be formed from similar or different materials.

In some examples, top insulation portion 317 and bottom insulation portion 318 each comprise an electrical insulator or dielectric material, such as a metal oxide material including hafnium oxides ($HfO_n$), tantalum oxides ($TaO_m$), zirconium oxides ($ZrO_p$), or any other suitable metal oxide, where 'n' and 'p' can vary based on levels of oxidation and reduction of the base chemical/metal. These metal oxides can comprise 'binary' metal oxides. Binary metal oxides discussed herein have properties that can be altered depending upon a level of oxidation, specifically resistive memory properties, conductive properties, or insulating properties. In a first oxidation range comprising a low oxidation state or highly reduced state, the binary metal oxide exhibits insulating properties. In a second oxidation range comprising a high oxidation state or low reduction state, the binary metal oxide exhibits conductive properties. The second oxidation range can be employed for forming terminals or electrode portions, such as source and drain terminals.

In a third oxidation range, or middle state, the binary metal oxide will exhibit resistive memory properties which can be altered to store bits of data, and can be employed as resistive NVM material 310. When employed in three-terminal resistive memory devices, these materials can comprise flux linkage controlled resistor materials, where gate portions influence device operation by a voltage applied to the material or a current through the material. Other examples can have the resistive memory material comprising simple or complex transition metal oxides (i.e. titanium, zirconium, tungsten, ruthenium, yttrium, scandium, cobalt, nickel, copper), perovskites, delafossites, or mixed oxides, including combinations thereof. Further example resistive memory materials can include ones formed with doped $CuInO_2$, Mott transition materials, or Schottky barrier materials. Other materials are possible, including combinations thereof.

Gate portions discussed herein, such as optional gate 313, can comprise n-type or p-type semiconductor material, polycrystalline silicon material, or other material. Isolating gate oxides can be included between gate portions and associated memory cell portions. Gate portions can comprise a material that forms a rectifying junction with the material of the associated memory cell (such as an active channel of the resistive memory device), which isolates the gate and acts as a selector, such as an n-type semiconductor or an n-type polycrystalline silicon material. Other examples have the gate material comprising a p-type material, which would form a PN rectifying junction from memory cell-to-gate. PN junctions can be fabricated not only with classical semiconductors, but also with metal oxides. When PN junctions are employed, a resistance level can be measured through the gate associated with a memory cell, as current can flow from the resistive memory material of the memory cell through the gate, but not in reverse due to the PN junction. In other examples, no PN rectifying junction is formed between gate and memory cell. In this other example, the gate is not electrically isolated from the channel, and resistance values for a memory cell can be measured from gate-to-channel.

FIG. 4 illustrates a process of manufacturing filled-via memory devices as one example of a resistive memory devices and resistive memory array. In FIG. 4, three configurations are shown to illustrate various steps in a manufacturing process for a resistive memory array. The associated resistive memory devices can comprise two-terminal (source-active channel-drain) or three-terminal devices (source-active channel-drain with gate). Gate portions in FIG. 4 are omitted for clarity. It should be understood that further quantities of devices can be included and many layers of the devices can be formed by stacking individual arrays.

In configuration 401, a layer of bottom terminal material 412 is established below a layer of insulator material 418. Bottom material 412 can comprise metallization in some examples or instead can comprise a metal oxide in a high oxidation state or low reduction state, such as tantalum oxide or hafnium oxide in a high oxidation state or low reduction state. Insulator material 418 comprises an electrically insulating material, such as a high-κ material. In this example, insulator material comprises zirconium or an oxide of zirconium, although other materials can be employed.

In configuration 402, vias 430 have been formed in insulator material layer 418 to reach bottom terminal layer 412. Vias 430 can be formed using various semiconductor micromachining techniques or microfabrication techniques, such as milling, patterned masking/etching, or other techniques. Each via 430 will define a resistive memory cell or a ReRAM device.

In configuration 403, vias 430 have each been filled with resistive memory material, specifically, resistive NVM material 410 and a top terminal layer 411 has been established over insulator material layer 418 and NVM material 410. Insulator material 418 at the interface with resistive NVM material 410 forms insulated sidewalls 420. Heating or other processes can be performed after resistive NVM material 410 is filled into vias 430 to diffuse a portion of insulator material 418 into resistive NVM material 410. As can be seen in configuration 403, current paths 421 are shown as forming in a central portion of each memory cell formed by resistive NVM material 410. These current paths would be preferred during operation between top terminal 411 and bottom terminal 412 instead of along sidewalls of resistive NVM material 410. Insulator material 418 compensates for any sidewall material irregularities or surface defects in resistive NVM material 410 from milling or deposition of resistive NVM material 410. Surface defects or sidewall irregularities in resistive NVM material 410 can lead to unwanted conduction paths along the sidewalls of resistive NVM material 410. Further diffusion of insulator material 418 into resistive NVM material 410 can further reduce sidewall conduction paths.

Thus, in configuration 403 of FIG. 4, three resistive memory devices 450 have been formed, with source terminals formed by the top terminal layer and drain terminals formed by the bottom terminal layer. Active zones or active channels of each resistive memory device is formed from resistive memory material deposited into vacated vias formed into insulator material. Further layers of these devices can be stacked vertically to form many layers of resistive memory devices. Moreover, optional gate elements (not shown in FIG. 4) can be included proximate to the active channels of resistive memory material to electrically alter resistance properties of the active channels to store bits of data. Stored data can be read by detecting resistance of each memory cell by drawing current through the associated active channels. In two-terminal resistive memory devices, the gate elements can be omitted.

FIG. 5 is a system diagram illustrating an example resistive memory array. Specifically, ReRAM array 501 is shown in FIG. 5 as comprising fifteen (15) ReRAM devices in a vertically stacked arrangement. Other quantities of ReRAM devices can be included and multiple horizontal layers of ReRAM devices can be employed, such as to have both rows and columns of ReRAM devices forming a three-dimensional (3D) arrangement. ReRAM device 502 is shown as an exemplary device found in ReRAM array 501, although variations are possible. ReRAM device 503 is shown as a 3D isometric solid illustration of an ReRAM device which can be employed in array 501.

Turning first to array 501, the vertical arrangement has active channels of columns of ReRAM device coupled vertically to form individual wordlines of a memory array, with source and drain terminals integrated into the vertical wordlines for each device (see device 503). The vertical arrangement also has gate portions of rows of ReRAM devices coupled horizontally to form individual bitlines of a memory array. Using a selected wordline and bitline, a control system can selectively write and read from ones of the ReRAM devices, such as in addressable memory configurations.

Current 535 is shown as able to flow through each vertical column comprising the active channels and source/drain terminal for each ReRAM device of the column. Moreover, since the ReRAM devices in array 501 employ sidewall doping as discussed herein, conduction paths for current 535 form generally in the central portions of the active channels of each ReRAM device instead of along the sidewalls.

Device 502 is a detailed view of any of the ReRAM devices in array 501. Device 502 includes active channel 510, source terminal 511, drain terminal 512, gate terminal 513, and doped sidewalls 515. Gate terminal 513 surrounds a central active channel in device 502, and the side view of device 502 in FIG. 5 illustrates this feature.

Further detail is shown in device 503, with gate terminal 513 surrounding a central active channel 510 which itself is surrounded by doped sidewalls 515. Device 503 further shows an alternative example with interconnect portions 540 that include source 511 and drain 512. Memory cell 541 is surrounded by gate 513 and gate 513 can alter resistance properties of memory cell 541 proximate to gate 513.

In FIG. 5, the active channels 510 of each ReRAM device comprise a metal oxide material, such as an oxide of tantalum or an oxide of hafnium. Doped sidewalls 515 comprise a layer of zirconium-rich material, which can be a distinct layer deposited onto sidewalls of active channel material or an at least partially diffused layer of dopant into the sidewalls of active channel material. Further active channel and dopant material are discussed herein.

Figure 6:
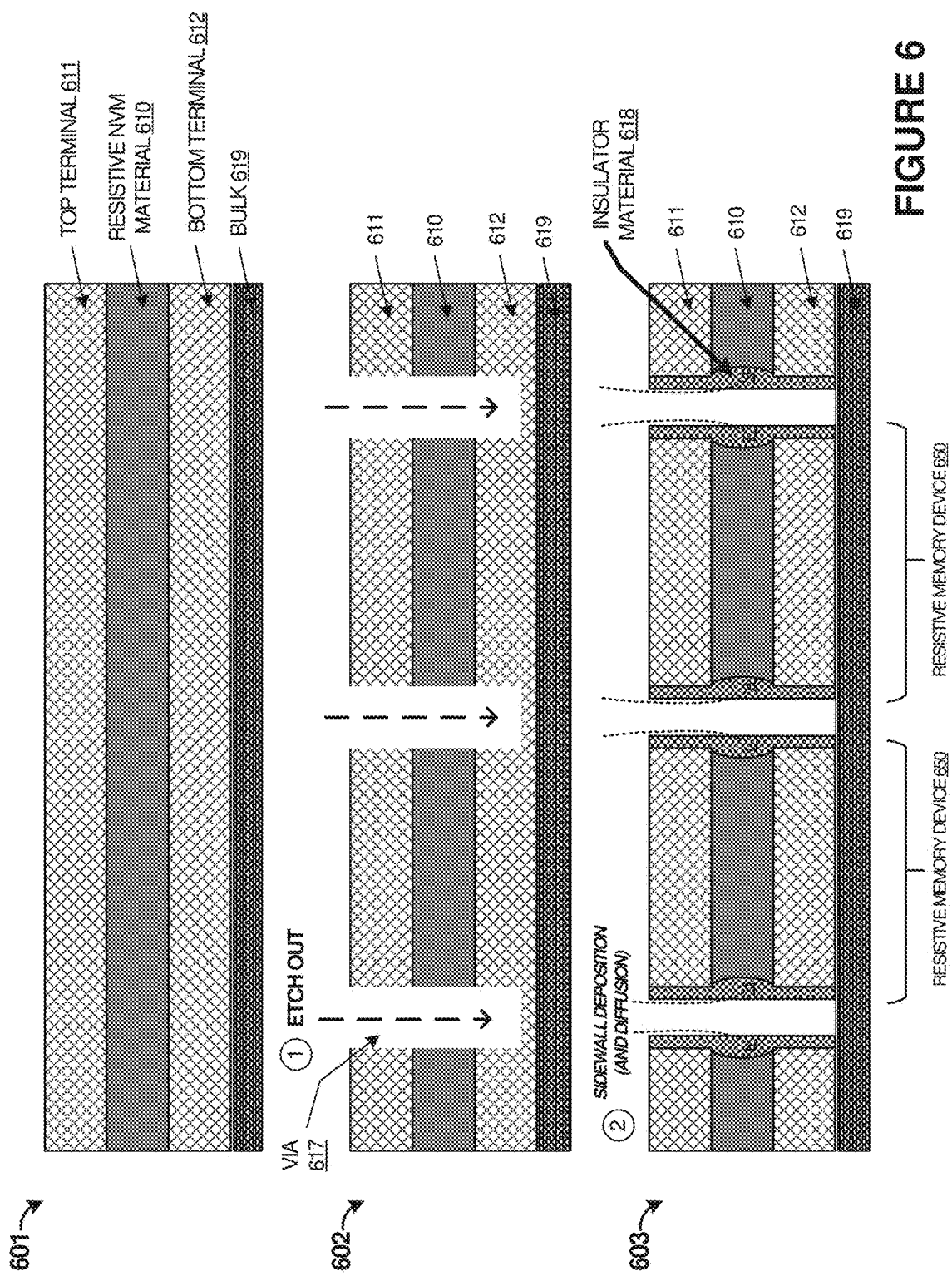
FIG. 6 illustrates manufacture of resistive memory arrays.

FIG. 6 illustrates manufacture of resistive memory arrays in an example. The associated resistive memory arrays can include two-terminal or three-terminal devices. FIG. 6 illustrates deposited sidewall devices. In FIG. 6, a first configuration 601 illustrates a layered configuration established by layering different materials onto a substrate or bulk, such as optional bulk 619. Other substrates can be employed, such as when arrays of resistive memory devices are formed onto sublayers of logic and related interconnect. Bottom terminal layer 612 is formed on top of bulk 619, resistive NVM material 610 is formed on top of layer 612, and top terminal layer 611 is formed on top of layer 610. These layers can be formed using various semiconductor manufacturing processes or material deposition techniques, such as atomic layer deposition (ALD), chemical vapor deposition (CVD), sputtering, gas/plasma deposition, or other processes, including combinations thereof.

Configuration 602 shows vias 617 etched or milled through layers 611, 610, and 612. Vias 617 can be formed into at least a portion of layer 612, or can be formed through the entire thickness of layer 612. Configuration 603 shows sidewall material deposited as insulator material 618 into each via, specifically, onto the sidewalls formed by vias 617. Insulator material 618 can be any of the dopant material discussed herein, such as a zirconium material. One specific example of a zirconium material includes zirconium oxide ($ZrO_2$). Insulator material 618 can include high-κ dielectrics. In one example, resistive NVM material 610 comprises tantalum oxide, and insulator material 618 comprises hafnium-doped tantalum oxide. In another example, resistive NVM material 610 comprises tantalum oxide, and insulator material 618 comprises zirconium-doped tantalum oxide or zirconium-doped hafnium oxide. In yet another example, resistive NVM material 610 comprises hafnium oxide, and insulator material 618 comprises tantalum-doped hafnium oxide. Other sidewall/dopant material can be employed, such as those discussed herein. Moreover, after deposition, insulator material 618 can be diffused into sidewalls of each via (which includes diffusion into a portion of material 610) using various diffusion techniques, such as heating. It should be understood that usage of tantalum oxide or hafnium oxide refers to various oxides of tantalum or hafnium, with amounts of oxidation selected to provide for resistive memory properties of the associated memory cell. Insulator material 618 can be deposited using various material deposition techniques, such as ALD, CVD, sputtering, gas/plasma deposition, or other processes, including combinations thereof.

Thus, in FIG. 6, at least two resistive memory devices 650 have been formed. Each resistive memory device has a first terminal formed by a portion of layer 611 and a second terminal formed by a portion of layer 612. Source and drain designations can correspond to ones of the first/second terminals. Once material 618 is deposited and optionally diffused, then the remaining void portions of vias 617 can be filled with further material, such as an insulating material. In some examples, material 618 is deposited to substantially fill each via 617, and additional material is not employed.

Figure 7:
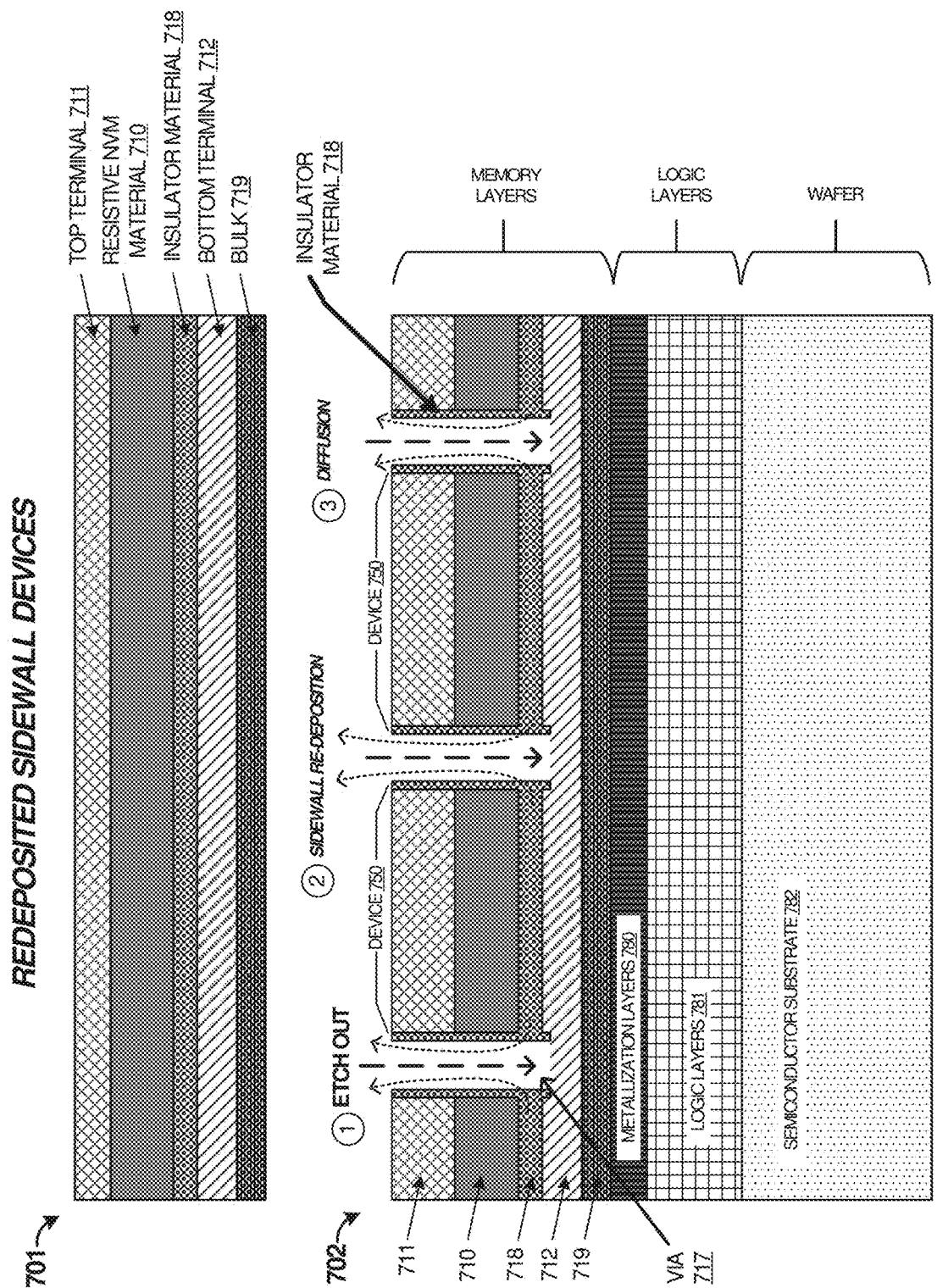
FIG. 7 illustrates manufacture of resistive memory arrays.

FIG. 7 illustrates manufacture of resistive memory arrays in an example. The associated resistive memory arrays can include two-terminal or three-terminal devices. FIG. 7 illustrates re-deposited sidewall devices. In FIG. 7, a first configuration 701 illustrates a layered configuration established by layering different materials onto a substrate or bulk, such as optional bulk 719. Other substrates can be employed, such as when arrays of resistive memory devices are formed onto sublayers of logic and related interconnect, which is shown in configuration 702 in FIG. 7. Bottom terminal layer 712 is formed on top of bulk 719. Insulator material layer 718 is formed on top of layer 712. Resistive NVM material layer 710 is formed on top of layer 718, and top terminal layer 711 is formed on top of layer 710. These layers can be formed using various semiconductor manufacturing processes or material deposition techniques, such as atomic layer deposition (ALD), chemical vapor deposition (CVD), sputtering, gas/plasma deposition, or other processes, including combinations thereof.

Insulator material layer 718 can be any of the dopant material discussed herein, such as a zirconium material. One specific example of a zirconium material includes zirconium oxide ($ZrO_2$). Insulator material layer 718 can include high-κ dielectrics. In one example, resistive NVM material 710 comprises tantalum oxide, and insulator material 718 comprises hafnium-doped tantalum oxide. In another example, resistive NVM material 710 comprises tantalum oxide, and insulator material 718 comprises zirconium-doped tantalum oxide or zirconium-doped hafnium oxide. In yet another example, resistive NVM material 710 comprises hafnium oxide, and insulator material 718 comprises tantalum-doped hafnium oxide. It should be understood that usage of tantalum oxide or hafnium oxide refers to various oxides of tantalum or hafnium, with amounts of oxidation selected to provide for resistive memory properties of the associated memory cell. Other material can be employed, such as those discussed herein.

Configuration 702 shows vias 717 etched or milled through layers 711, 710, 718, and 712. Vias 717 can be formed into at least a portion of layer 712, or can be formed through the entire thickness of layer 712. The process of forming vias 717 through each layer can re-deposit material of a current layer being etched or milled onto sidewalls of the associated via. The stackup of the layers of configuration 701 are such that when vias 717 are etched/milled, material from layer 718 is re-deposited onto sidewalls of the vias. Thus, material is re-deposited from a layer underlying resistive NVM material 710 onto sidewalls of each via and likewise onto sidewalls formed into resistive NVM material 710. In some examples, layer 718 comprises a zirconium (Zr) material which is subsequently oxidized ($ZrO_2$) after re-deposition onto the sidewalls of each via. Configuration 702 shows sidewall material re-deposited as insulator material 718 into each via, specifically, onto the sidewalls formed by vias 717. Moreover, after deposition, insulator material 718 can be diffused into sidewalls of each via (which includes diffusion into a portion of material 710) using various diffusion techniques, such as heating.

Thus, in FIG. 7, at least two resistive memory devices 750 have been formed. Each device 750 has a first terminal formed by a portion of layer 711 and a second terminal formed by a portion of layer 712. Source and drain designations can correspond to ones of the first/second terminals. Once material 718 is re-deposited and optionally diffused, then the remaining void portions of vias 717 can be filled with further material, such as an insulating material.

Configuration 702 also shows the resistive memory array formed as one or more layers onto a plurality of sublayers. The resistive memory array can be built up vertically (i.e. in a 'z' direction) from a wafer or substrate, such as shown for wafer 590 in FIG. 5. The ReRAM array can be formed onto one or more sublayers, such as metallization layers 780, logic layers 781, and semiconductor substrate layers 782, among other layers. The underlying logic and interconnect can be related to a logic circuits, processors, control systems, or other elements which can at least control the elements of the resistive memory array layers formed on top of semiconductor layers. For example, when a semiconductor wafer is employed for creation of logic circuitry and associated interconnect, then one or more layers of resistive memory can be formed on top of logic circuitry and associated interconnect using techniques found in semiconductor wafer processing and microfabrication, such as photo-lithography, diffusing, deposition, epitaxial growth, etching, annealing, and ion implanting, among others.

Figure 8:
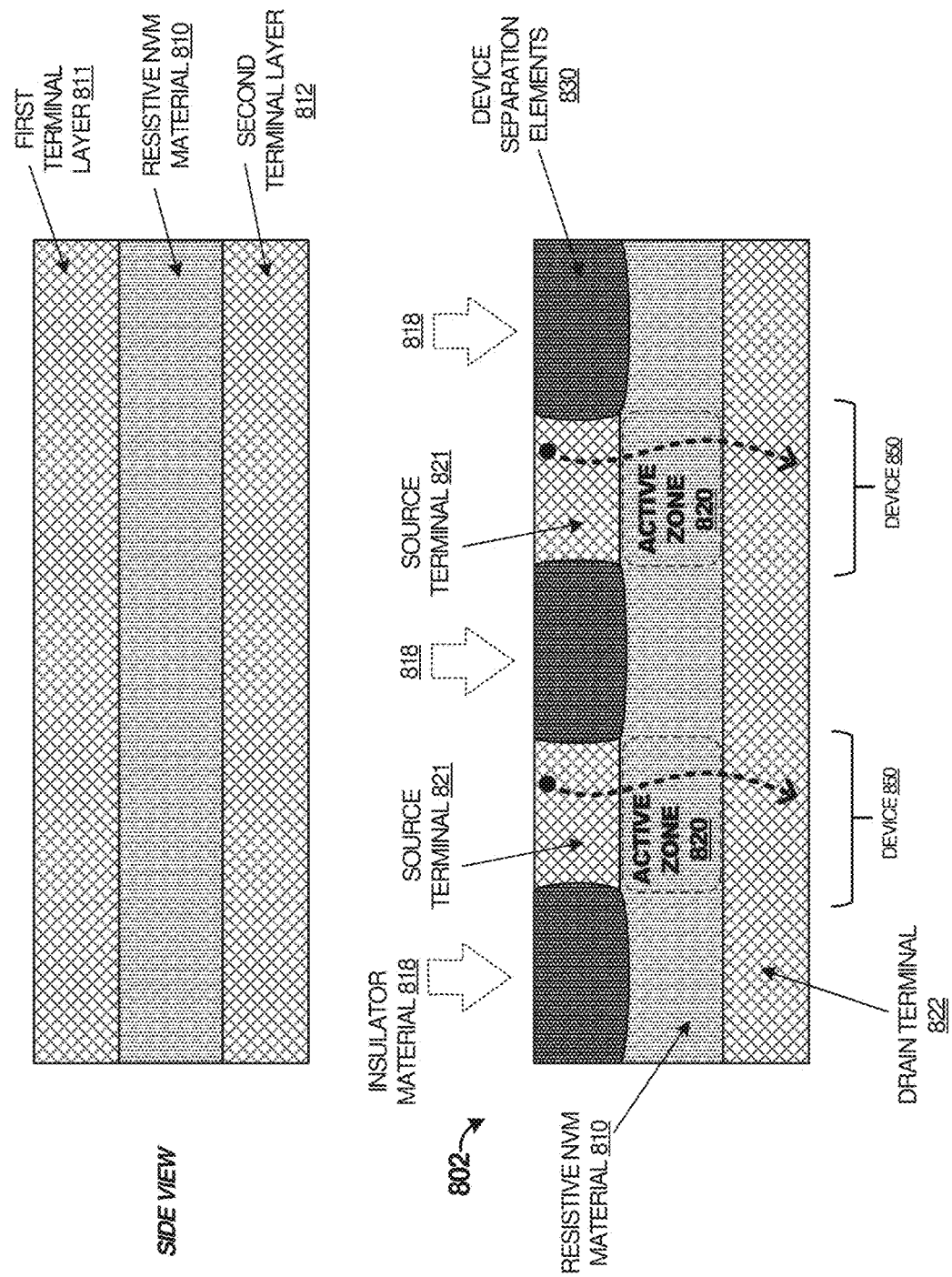
FIG. 8 illustrates a resistive memory device.

FIG. 8 illustrates a resistive memory device in an example. FIG. 8 includes configurations for manufacturing processes employed in formation of two top point resistive memory devices 850. In configuration 801, a first layer is formed comprising bottom terminal layer 812 which can be shared among the resistive memory devices. A second layer is formed onto layer 812 comprising resistive NVM material layer 810 which houses active zones 820 or active channels for the resistive memory devices. A third layer is formed onto layer 810 comprising top terminal layer 811. First layer 811 and second layer 812 can comprise materials described herein for source and drain terminals. It should be understood that positioning of source and drain layers and associated terminals can be swapped in other examples.

In configuration 802, insulator material 818 is introduced to form source terminals 821 and form device separation elements 830 which separate source terminals of individual resistive memory devices 850. Insulator material 818 can provide enhanced operation of an active zone of resistive memory devices by at least compensating for irregularities and defects at the periphery of active zones 820 comprising resistive NVM material. Specifically, insulator material 818 can increase a dielectric property of the periphery of active zones 820 to reduce conductance paths proximate to the periphery and push current flow into a more central area of the active zone of each resistive memory device.

Insulator material 818 can be any of the dopant material discussed herein, such as a zirconium material. One specific example of a zirconium material includes zirconium oxide ($ZrO_2$). Insulator material 818 can include high-κ dielectrics. In one example, resistive NVM material 810 comprises tantalum oxide, and insulator material 818 comprises hafnium-doped tantalum oxide. In another example, resistive NVM material 810 comprises tantalum oxide, and insulator material 818 comprises zirconium-doped tantalum oxide or zirconium-doped hafnium oxide. In yet another example, resistive NVM material 810 comprises hafnium oxide, and insulator material 818 comprises tantalum-doped hafnium oxide. After introduction, insulator material 818 can be diffused into surrounding materials of layer 810 and source terminals 821 using various diffusion techniques, such as heating. It should be understood that usage of tantalum oxide or hafnium oxide refers to various oxides of tantalum or hafnium, with amounts of oxidation selected to provide for resistive memory properties of the associated memory cell.

Elements 830 can be formed using various processes. In a first example process, insulator material 818 is introduced into layer 811, such as by masked/patterned diffusion of insulator material 818 into selective portions of layer 811. This selective introduction of material 818 can alter chemical and electrical properties of layer 811 at portions of layer 811 where material 818 is introduced. These altered properties can provide isolation and electrical insulation, while pushing conductance paths for resistive memory devices into central portions of associated active zones 820. In a second example process, portions of layer 811 are etched or otherwise removed in a selective matter, such as using masked etching or selective milling. Insulator material 818 can then be deposited into voids created during the etching/milling process. Insulator material 818 can be deposited using various material deposition techniques, such as ALD, CVD, sputtering, gas/plasma deposition, or other processes, including combinations thereof.

Thus, two resistive memory devices 850 are created in configuration 802, with current flow shown with associated dashed arrows in FIG. 8. Additionally, gate elements can be optionally formed proximate to active zones 820 to electrically modify resistances or resistance properties of associated ones of active zones 820 and store one or more bits of data using the modified resistance properties of the active zones.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above can be combined in various ways to form multiple embodiments. As a result, the invention is not limited to the specific embodiments described above, but only by the claims and their equivalents.

What is claimed is:

1. A method of manufacturing a plurality of resistive memory devices, the method comprising:
    forming a first active region, a second active region, and a third active region, the first, second, and third active regions each comprising a resistive memory material having resistance properties that can be electrically modified to store one or more data bits, wherein forming the first, second, and third active regions comprises:
        stacking a plurality of arrays by depositing a first layer comprising the resistive memory material and a second layer comprising the resistive memory material,
        establishing a first via feature and a second via feature in the first layer comprising the resistive memory material to form the first and third active regions in a first array of the plurality of arrays, and
        establishing a third via feature in the second layer comprising the resistive memory material to form the second active region in a second array of the plurality of arrays;
    forming at least one sidewall portion in each of the first, second, and third active regions by at least introducing a dopant configured to suppress conductance paths in the active region proximate to the at least one sidewall portion; and
    forming terminals against associated sides of each of the first, second, and third active regions, wherein a first terminal of the first active region electrically and physically contacts a second terminal of the second active region, and wherein the first active region and the third active region share a third terminal.

2. The method of claim 1, wherein the dopant increases dielectric properties of the at least one sidewall portion.

3. The method of claim 1, wherein the dopant comprises a dielectric material diffused into the at least one sidewall portion of each of the first, second, and third active regions.

4. The method of claim 1, wherein each of the first, second, and third active regions comprises an oxide of tantalum, and wherein the dopant comprises at least one of an oxide of hafnium and an oxide of zirconium.

5. The method of claim 1, wherein the first terminal comprises a source terminal proximate to a first sidewall of the first active region, wherein the second terminal comprises a drain terminal proximate to a second sidewall of the first active region different than the first sidewall, wherein the at least one sidewall portion of the first active region comprising the dopant comprises at least a third sidewall of the first active region different than the first and second sidewalls.

6. The method of claim 1, wherein forming the first, second, and third active regions further comprises depositing the dopant onto a wall of each of the first, second, and third via features and diffusing at least a portion of the dopant from the wall each of the first, second, and third via features into the resistive memory material at the at least one sidewall portion of the first, second, and third active regions.

7. The method of claim 1, wherein forming the first, second, and third active regions further comprises depositing the dopant onto a wall of each of the first, second, and third via features from creation of the first, second, and third via features into a sublayer comprising the dopant and diffusing at least a portion of the dopant from the wall of each of the first, second, and third via features into the resistive memory material at the at least one sidewall portion of the first, second, and third active regions.

8. The method of claim 1, wherein the first terminal is a source terminal, the second terminal is a drain terminal, and the third terminal is a gate terminal.

9. The method of claim 1, wherein the first terminal and the second terminal are integrated into a wordline.

10. A method of manufacturing three or more resistive memory devices, the method comprising:
   stacking a plurality of array, wherein forming a first array and a second array of the plurality of arrays comprises:
      depositing a first bottom terminal layer and a second bottom terminal layer;
      depositing a first insulator layer on the first bottom terminal layer and a second insulator layer on the second bottom terminal layer;
      forming first and second vias in the first insulator layer and a third via in the second insulator layer, wherein the first and second vias extend to the first bottom terminal layer and the third via extends to the second bottom terminal layer;
      filling the first and second vias with resistive memory material to form a first resistive memory material filled via and a second resistive memory material filled via in the first array of the plurality of arrays;
      filling the third via with resistive memory material to form a third resistive memory material filled via in the second array of the plurality of arrays;
      depositing a first top terminal layer over the first insulator layer and the first and second resistive memory material filled vias and a second top terminal layer over the second insulator layer and the third resistive memory material filled via, wherein the first and second resistive memory material filled vias are coupled to and in contact with the first bottom terminal layer and the top first terminal layer; and
      forming gate elements proximate to the first, second, and third resistive memory material filled vias; and
   diffusing a portion of the first insulator layer into the resistive memory material of the first array and a portion of the second insulator layer into the resistive memory material of the second array, wherein the first resistive memory filled via and the third resistive memory filled via share a gate terminal.

11. The method of claim 10, wherein diffusing the portion of the first insulator layer and the second insulator layer into the resistive memory material comprises heating the three or more resistive memory devices.

12. The method of claim 10, wherein the three or more vias are formed by at least one of milling and patterned masking and etching.

13. The method of claim 10, wherein the resistive memory material comprises resistive non-volatile memory material.

14. The method of claim 10, wherein the first insulator layer comprises zirconium or an oxide of zirconium.

15. The method of claim 10, wherein the bottom terminal layer is a source terminal and the top terminal layer is a drain terminal.

16. The method of claim 10, wherein the bottom terminal layer and the top terminal layer are integrated into a wordline.

17. A method of manufacturing three or more resistive memory devices, the method comprising:
   stacking a plurality of arrays, wherein forming a first array of the plurality of arrays comprises:
      depositing a bottom terminal layer on a substrate;
      depositing a resistive memory material layer on the bottom terminal layer;
      depositing a top terminal layer on the resistive memory material layer;
      etching first and second vias through the top terminal layer, the resistive memory material layer, and the bottom terminal layer to establish first and second vias in the resistive memory layer;
   depositing dopant material in each of the first and second vias, wherein the dopant material is deposited on sidewalls of each of the first and second vias such that the dopant material is in contact with the top terminal layer, the resistive memory material layer, and the bottom terminal layer; and
   diffusing the dopant material into the sidewalls of each of the first and second vias to form a first resistive memory device and a second resistive memory device, wherein the first resistive memory device and the second resistive memory device share a gate terminal, and wherein a top terminal of a third resistive memory device formed in a second array of the plurality of arrays electrically and physically contacts a bottom terminal of the first resistive memory device.

18. The method of claim 17, wherein the dopant material is deposited on the sidewalls of each of the first and second vias using at least one of atomic layer deposition, chemical vapor deposition, and sputtering.

19. The method of claim 17, wherein the top terminal layer, the resistive memory material layer, and the bottom terminal layer are deposited using at least one of atomic layer deposition, chemical vapor deposition, and sputtering.

20. The method of claim 17, wherein the bottom terminal layer is a source terminal and the top terminal layer is a drain terminal.

* * * * *